United States Patent
Cai et al.

(10) Patent No.: US 10,447,044 B2
(45) Date of Patent: Oct. 15, 2019

(54) SWITCHING CONTROL CIRCUIT AND CONTROL METHOD

(71) Applicant: Silergy Semiconductor Technology (Hangzhou) LTD, Hangzhou, ZheJiang Province (CN)

(72) Inventors: Yongbin Cai, Hangzhou (CN); Junjie Li, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 268 days.

(21) Appl. No.: 15/451,563

(22) Filed: Mar. 7, 2017

(65) Prior Publication Data

US 2017/0271883 A1    Sep. 21, 2017

(30) Foreign Application Priority Data

Mar. 21, 2016 (CN) .......................... 2016 1 0160656

(51) Int. Cl.

| | | |
|---|---|---|
| *H02J 4/00* | (2006.01) | |
| *H02M 3/158* | (2006.01) | |
| *H02M 3/157* | (2006.01) | |
| *H03K 17/687* | (2006.01) | |
| *H03K 17/693* | (2006.01) | |
| *H02J 1/10* | (2006.01) | |
| *H02M 1/00* | (2006.01) | |

(52) U.S. Cl.
CPC ................ *H02J 4/00* (2013.01); *H02J 1/102* (2013.01); *H02M 3/157* (2013.01); *H02M 3/158* (2013.01); *H03K 17/6874* (2013.01); *H03K 17/693* (2013.01); *H02M 2001/0003* (2013.01)

(58) Field of Classification Search
None
See application file for complete search history.

(56) References Cited

U.S. PATENT DOCUMENTS

| | | | | |
|---|---|---|---|---|
| 6,137,274 A | * | 10/2000 | Rajagopalan | ........... H02J 1/102 323/272 |
| 8,067,925 B2 | | 11/2011 | Grimm | |
| 8,086,355 B1 | * | 12/2011 | Stanczak | .............. H02H 1/0092 700/286 |
| 9,130,456 B2 | | 9/2015 | Yu et al. | |
| 9,317,019 B2 | | 4/2016 | Huang | |
| 9,985,525 B2 | * | 5/2018 | Zuo | .......................... H02M 1/08 |
| 2013/0148387 A1 | | 6/2013 | Ren et al. | |

* cited by examiner

*Primary Examiner* — Jared Fureman
*Assistant Examiner* — Joel Barnett
(74) *Attorney, Agent, or Firm* — Michael C. Stephens, Jr.

(57) ABSTRACT

A switching control circuit for controlling a multi-channel switching circuit having switching circuits, input terminals coupled to input voltage signals, and an output terminal for providing an output voltage signal, can include: a logic control circuit configured to receive an external operation signal and a first single pulse signal, and to generate an enable signal, a trigger signal, and feedback control signals; a reference voltage regulation circuit configured to receive the enable signal, the trigger signal, and a maximum one of the input voltage signals, and to generate a reference voltage signal; and feedback circuits corresponding to the switching circuits, where the plurality of feedback circuits are configured to receive the feedback control signals, a minimum one of two input voltage signals that are participating in the switching operation, the reference voltage signal, and the output voltage signal, and to generate switching control signals for controlling the switching circuits.

16 Claims, 11 Drawing Sheets

FIG. 1A (conventional)

FIG. 1B (conventional)

FIG. 2A (conventional)

FIG. 2B (conventional)

FIG. 3A (conventional)

FIG. 3B (conventional)

SWITCHING CONTROL CIRCUIT AND CONTROL METHOD

RELATED APPLICATIONS

This application claims the benefit of Chinese Patent Application No. 201610160656.9, filed on Mar. 21, 2016, which is incorporated herein by reference in its entirety.

FIELD OF THE INVENTION

The present invention generally relates to the field of switching power supplies, and more particularly to switching control circuits and methods.

BACKGROUND

Switch mode power supplies can efficiently convert electrical power from a source to a load, or to several different loads, with each corresponding to a different output. The main transistor of a switching-mode supply can switch between on and off states at a given operating frequency, and voltage regulation can be achieved by varying the ratio of the on-to-off time of the main transistor. Switch mode power supplies may have relatively high power conversion efficiency, as compared to other types of power converters. Switch mode power supplies may also be substantially smaller and lighter than a linear supply due to the smaller transformer size and weight.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1A:
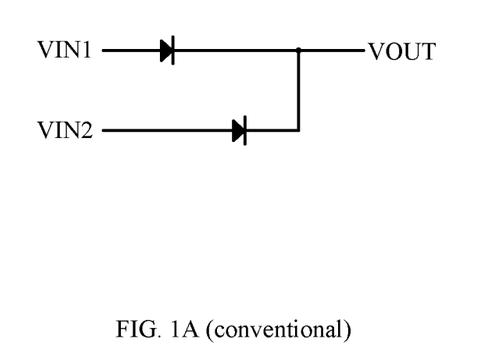
FIG. 1A is a schematic block diagram of a first example voltage switching circuit.
Figure 1B:
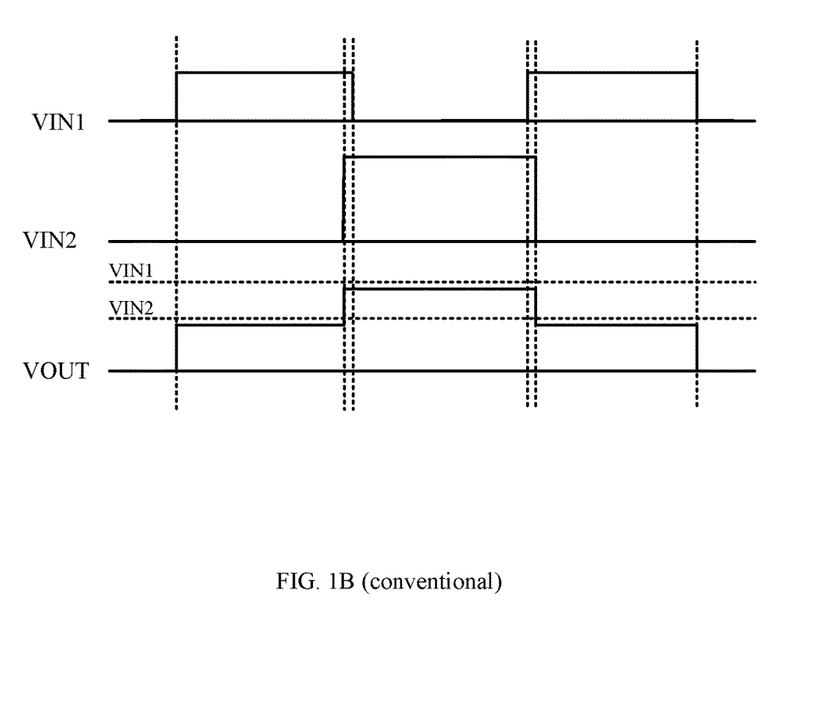
FIG. 1B is a waveform diagram of example operation the circuit of FIG. 1A.

In some applications with a plurality of input ports but only one output port, different input power supplies may be switched in order to obtain a desired output voltage signal. Referring now to FIG. 1A, shown is a schematic block diagram of a first example voltage switching circuit. FIG. 1B shows a waveform diagram of example operation the circuit of FIG. 1A. Here, the circuit with only two input ports is described as an example, and the input ports may be switched based on the property of unidirectional conductivity of diodes.

For each channel, one diode can be coupled to an input port at its anode terminal, and to an output port at its cathode terminal. When voltage VIN1 at the first input port is required, voltage VIN1 can be coupled to the input port, and voltage VOUT may be obtained by subtracting the voltage drop of a diode from voltage VIN1. When voltage VIN2 at the second input port is required, voltage VIN2 can be coupled to the input port, and if voltage VIN2 is greater than voltage VIN1, voltage VOUT can be obtained by subtracting the voltage drop of a diode from voltage VIN2. Voltage VIN1 at the first input port may also be shut down or otherwise disabled in this case. In this approach, a diode voltage drop exists between voltage VOUT and voltage VIN1 (or VIN2) during operation, and relatively large power losses may be generated when a load current is large. As a result, this approach may not be suitable for applications having high accuracy demands or heavy load requirements.

Figure 2A:
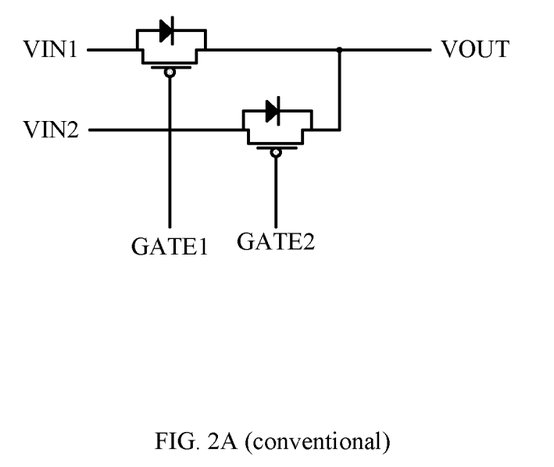
FIG. 2A is a schematic block diagram of a second example voltage switching circuit.
Figure 2B:
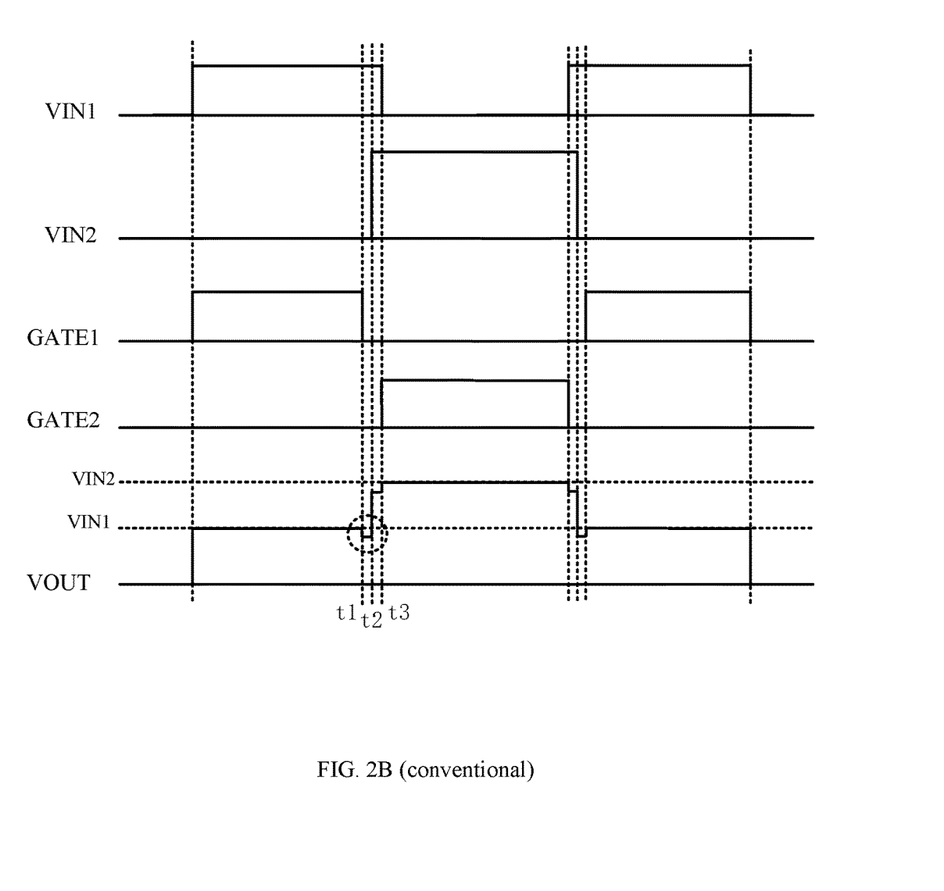
FIG. 2B is a waveform diagram of example operation of the circuit of FIG. 2A.

Referring now to FIG. 2A, shown is a schematic block diagram of a second example voltage switching circuit. FIG. 2B, shows a waveform diagram of example operation of the circuit of FIG. 2A. For each channel, a MOS transistor may serve as a switching circuit that is coupled to an input port. When voltage VIN1 at the first input terminal is required, the MOS transistor coupled to voltage VIN1 can be turned on, and when voltage VIN2 at the second input terminal is required, the MOS transistor coupled to voltage VIN2 can be turned on while the MOS transistor in the first channel may be slightly turned off in advance. As compared to the above approach, the system losses can be reduced by using the transistors, but in order to achieve unidirectional conduction that prevents current inversion, the MOS transistor may be turned off before the voltage is completely switched (e.g., time t1 to t3 in FIG. 2B). Thus, the output voltage may be less than the previous value by a diode voltage drop (e.g., VOUT during time t1 to time t2). However, in some applications (e.g., USB PD), even the voltage drop that equals a diode voltage drop may still be far beyond the allowable range.

Figure 3A:
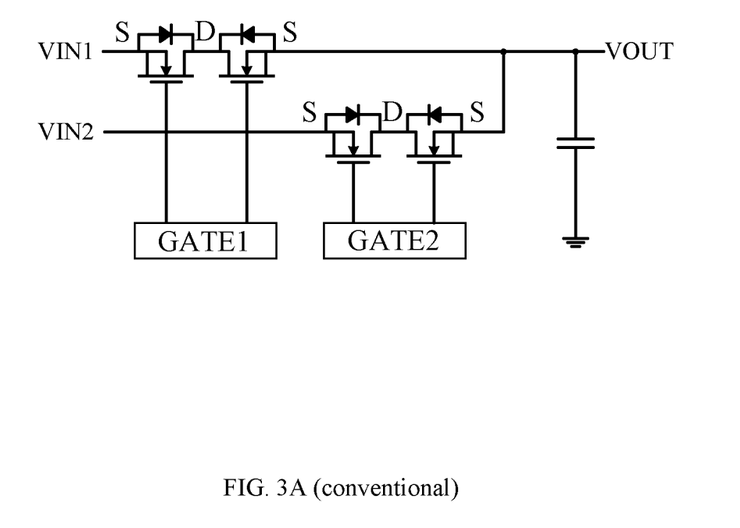
FIG. 3A is a schematic block diagram of a third example voltage switching circuit.
Figure 3B:
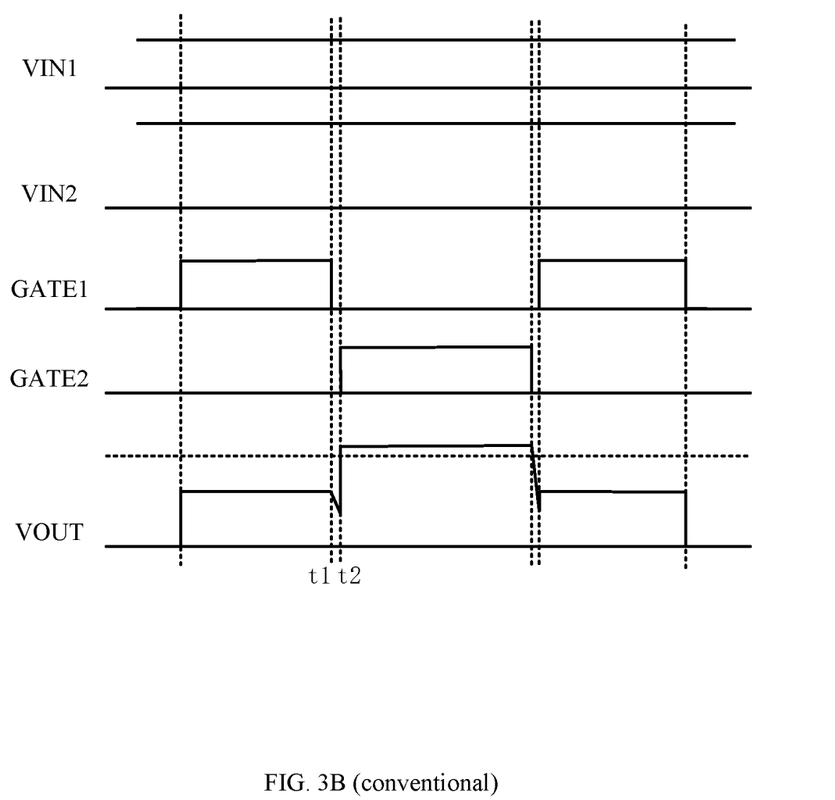
FIG. 3B is a waveform diagram of example operation of the circuit of FIG. 3A.

Referring now to FIG. 3A, shown is a schematic block diagram of a third example voltage switching circuit. FIG. 3B shows a waveform diagram of example operation of the circuit of FIG. 3A. In this example, when the output voltage is switched to voltage VIN2 at the second input terminal from voltage VIN1 at the first input terminal, the transistor in the first channel may initially be turned off, and then the transistor in the second channel can be turned on. Also, output voltage VOUT may be maintained by an output capacitor during a predetermined time period (e.g., from time t1 to time t2 in FIG. 3B). However, during the switching process there may be a drop in the output voltage, and the value of this drop can be related to the load, the output capacitor, and the dead time of signals GATE1, GATE2. When the output capacitor has a relatively low value, unacceptable output voltage drop may be generated, and in some applications, the upper limit of the output capacitor may be limited, which can result in greater output voltage fluctuations.

In one embodiment, a switching control circuit for controlling a multi-channel switching circuit having a plurality of switching circuits, input terminals respectively coupled to a plurality of input voltage signals, and an output terminal for providing an output voltage signal, can include: (i) a logic control circuit configured to receive an external operation signal and a first single pulse signal, and to generate an enable signal, a trigger signal, and a plurality of feedback control signals; (ii) a reference voltage regulation circuit configured to receive the enable signal, the trigger signal, and a maximum one of the plurality of the input voltage signals, and to generate a reference voltage signal; (iii) the reference voltage regulation circuit being configured to generate the first single pulse signal according to the reference voltage signal and a minimum one of two input voltage signals that are participating in a switching operation; and (iv) a plurality of feedback circuits corresponding to the plurality of switching circuits, where the plurality of feedback circuits are configured to receive the plurality of feedback control signals, a minimum one of two input voltage signals that are participating in the switching operation, the reference voltage signal, and the output voltage signal, and to generate a plurality of switching control signals for controlling the plurality of switching circuits.

Figure 4:
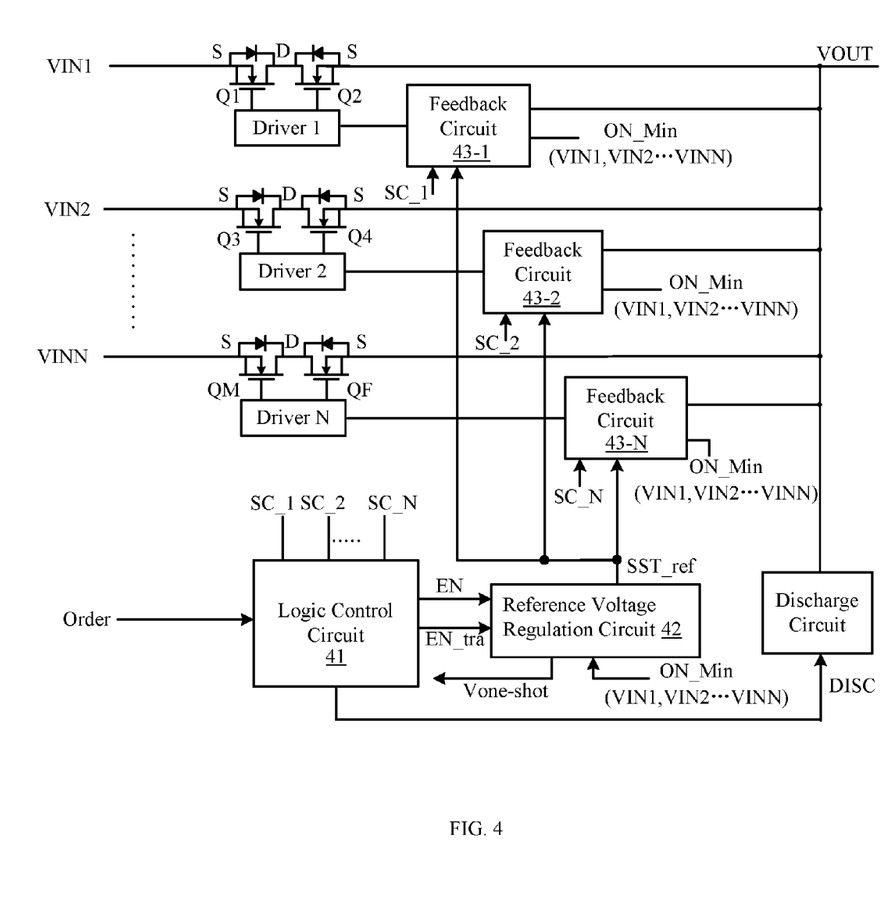
FIG. 4 is a schematic block diagram of an example switching control circuit, in accordance with embodiments of the present invention.

Referring now to FIG. 4, shown is a schematic block diagram of an example switching control circuit, in accordance with embodiments of the present invention. The example switching control circuit of FIG. 4 is configured for controlling a multi-channel switch circuit including first through Nth switch circuits. For example, the first switch circuit can include transistors Q1 and Q2, the second switch circuit can include transistors Q3 and Q4, and so on through the Nth switch circuit, which can include transistors QM and QF. The multi-channel switch circuit may have input terminals coupled to a plurality of input voltages (e.g., from VIN1 through VINN), and output terminals of all channels of the multi-channel switch circuit can connect to a common node as an output terminal to output (e.g., a predetermined) output voltage signal VOUT.

In this particular example, the switching control circuit can include logic control circuit 41, and feedback circuits 43-1 through 43-N. Logic control circuit 41 can receive external operation order "Order," and may generate enable signal EN, trigger signal EN_tra, and feedback control signals SC_1 through SC_N. The external operation signal Order may represent operation information (e.g., operation start, channel switching, etc.). When the external operation signal Order indicates an operation notice, enable signal EN can be activated, and the trigger signal may transition by activating or deactivating according to the operation signal. For example, control circuit 41 may be a trigger, a delay circuit, or components with similar functionality.

Reference voltage regulation circuit 42 can receive the enable signal, trigger signal EN_tra, and the maximum value of input voltage signal VIN1 through VINN, and may generate reference voltage signal SST_ref. In addition, reference voltage regulation circuit 42 may provide a single pulse signal (e.g., Vone-shot) to logic control circuit 41 according to reference voltage signal SST_ref and the minimum one of the two input voltage signals of the switching circuit to be switched, where the minimum one may be indicated as ON_Min(VIN1, VIN2 . . . VINN). Feedback circuits 43-1 through 43-N can be respectively coupled to corresponding switching circuits. The feedback circuits can respectively receive reference voltage signal SST_ref, feedback control signals SC_1 through SC_N, and the minimum one of two input voltage signals to be currently switched. The feedback circuits can also receive output voltage signal VOUT of the multi-channel switching circuit, and may generate switching control signals to further control the switching operations of the multi-channel switching circuit by corresponding drivers (e.g., driver 1 through driver N).

Figure 5:
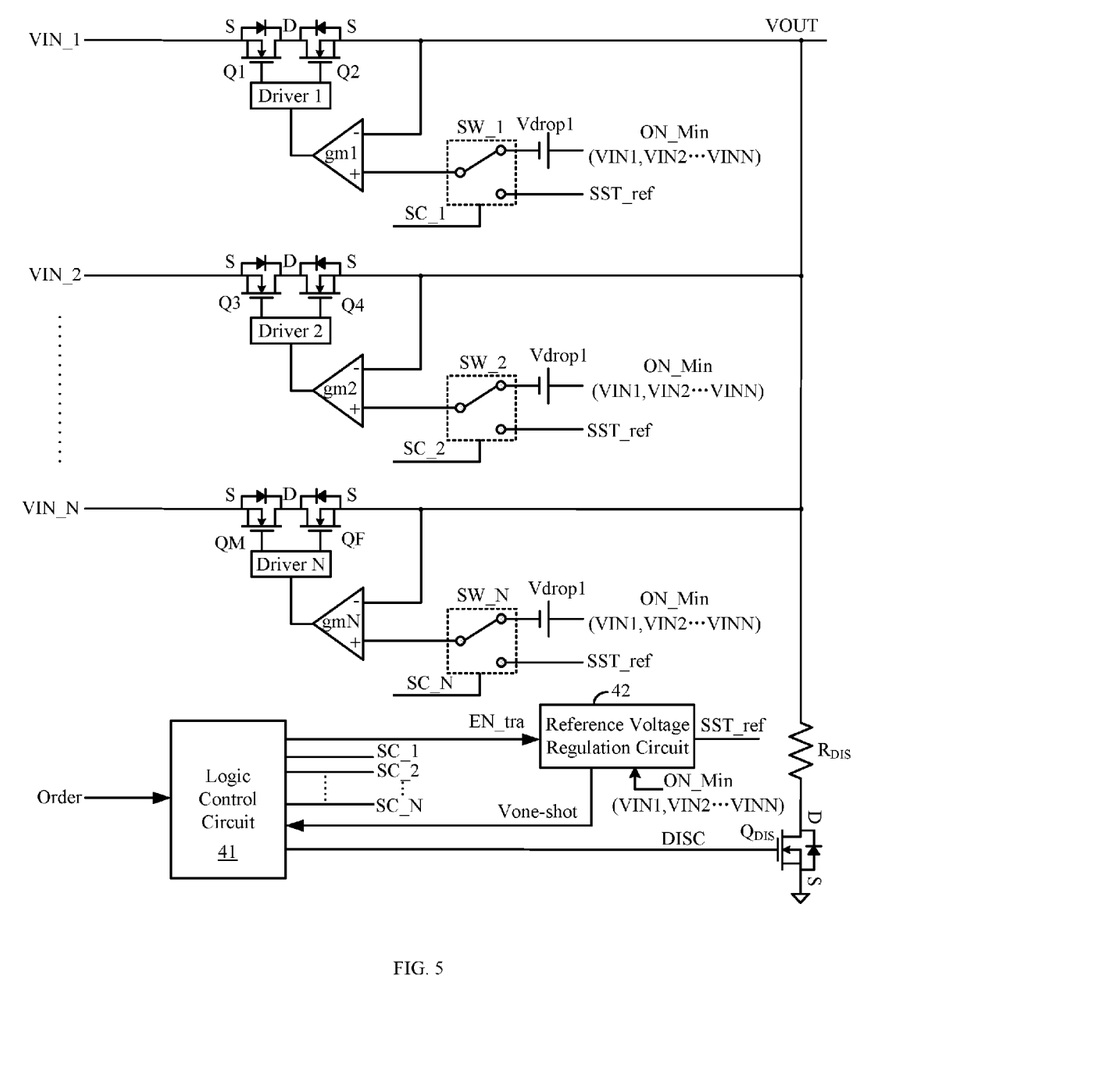
FIG. 5 is a more detailed schematic block diagram of the example switching control circuit, in accordance with embodiments of the present invention.

Referring now to FIG. 5, shown is a more detailed schematic block diagram of the example switching control circuit, in accordance with embodiments of the present invention. In this example, each feedback circuit can include signal selection circuit SW_N and a comparison circuit (e.g., a transconductance amplifier gmN). Signal selection circuit SW_N can receive the minimum one ON_Min(VIN1, VIN2 . . . VINN) of two input voltage signals to be switched currently, and reference voltage signal SST_ref, and may provide one of the received signals to a positive input terminal of the transconductance amplifier according to the corresponding feedback control signal SC_N. An inverting input terminal of the transconductance amplifier can receive output voltage signal VOUT of the multi-channel switching circuit, and may generate a switching control signal for a corresponding channel. For example, the switching control signal may have the same waveform as the signal output by the driver (e.g., driver N).

In this particular example, the signal selection circuit can include a single pole double throw switch. When the feedback control signal SC_N is active, the single pole double throw switch can provide reference voltage signal SST_ref to a positive input terminal of the transconductance amplifier. When feedback control signal SC_N is inactive, the single pole double throw switch can provide the minimum one ON_Min(VIN1, VIN2 . . . VINN) of two input voltage signals to be switched to the positive input terminal of the transconductance amplifier. Those skilled in the art will recognize that the signal selection circuit is not limited to the above mentioned single pole double throw switch, but also can be implemented by two parallel coupled switches, or other suitable circuits with similar functionality.

In this way, the occurrence of relatively large drops of the output voltage, or the output voltage being decreased to zero, can be substantially avoided by maintaining output voltage VOUT as the minimum one ON_Min(VIN1, VIN2 . . . VINN) of two input voltage signals to be switched when feedback control signal SC_N is inactive. This can substantially avoid possible damage to the load that is coupled to the output terminal. In this example, each feedback circuit also may also include voltage source Vdrop1 having an anode for receiving the minimum one of two input voltage signals to be switched, and a cathode connected to the input terminal of the signal selection circuit. For example, the switching control circuit may also include a discharge circuit having discharge resistor RDI and discharge switch QDIs connected in series between the output terminal and ground. The discharge switch may be controlled by discharge control signal DISC generated by logic control circuit 41.

Figure 6A:
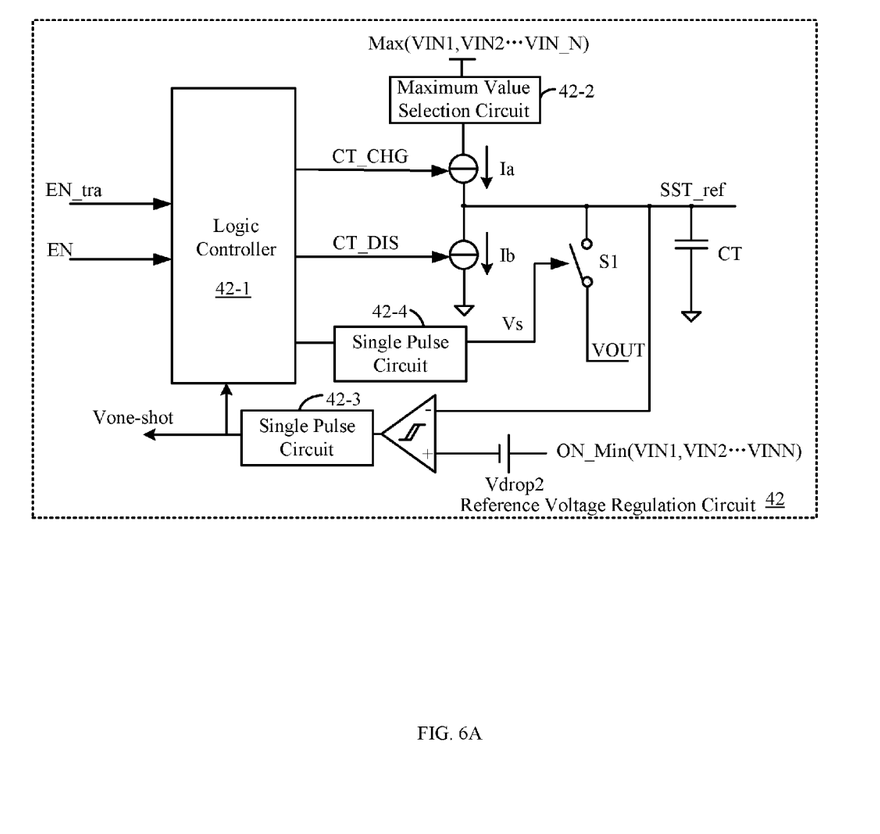
FIG. 6A is a schematic block diagram of an example reference voltage regulator configured for the switching control circuit of FIG. 5, in accordance with embodiments of the present invention.

Referring now to FIG. 6A, shown is a schematic block diagram of an example reference voltage regulator configured for the switching control circuit of FIG. 5, in accordance with embodiments of the present invention. In this example, the reference voltage regulation circuit can include logic controller 42-1, a charge and discharge circuit, and single pulse signal generator 42-3. Logic controller 42-1 can receive enable signal EN and trigger signal EN_tra, and may generate charge signal CT_CHG and discharge signal CT_DIS. The charge and discharge circuit can include charge current source Ia, discharge current source Ib, and capacitor CT. The charge current source can receive the maximum one Max(VIN1, VIN2 . . . VINN) of the input voltage signals, and can connect to a first terminal of capacitor CT. The discharge current source Ib can connect in parallel to capacitor CT, and a second terminal of capacitor CT may be grounded. For example, a voltage across capacitor CT may be configured as reference voltage signal SST_ref.

Charge current source Ia can receive charge signal CT_CHG, and may charge capacitor CT when the charge signal is active. Discharge current source Ib can receive discharge signal CT_DIS, and may discharge capacitor CT when the discharge signal is active. Single pulse signal generator 42-3 can receive reference voltage signal SST_ref and the minimum one ON_Min(VIN1, VIN2 . . . VINN) of two input voltages to be switched, and may generate single pulse signal Vone-shot. For example, the maximum one of the input voltage signals can be determined by maximum value selection circuit 42-2. Maximum value selection circuit 42-2 can receive a plurality of input voltage signals, and may select the maximum one by a selection component, such as including transistors.

In this particular example, signal pulse generator 42-3 can also include a hysteresis comparator associated with the single pulse generator. The hysteresis comparator may have a non-inverting input terminal for receiving the minimum one ON_Min(VIN1, VIN2 . . . VINN) of two input voltage signals to be switched, and an inverting input terminal for receiving reference voltage signal SST_ref, the output terminal for outputting a hysteresis comparison signal, and single pulse signal Vone-shot is generated by processing the hysteresis comparison signal via the first single pulse generator.

Single pulse generator 42-3 can also include voltage source Vdrop2 having an anode for receiving the minimum one of two input voltage signals to be switched currently and a cathode being coupled to a non-inverting input terminal of the hysteresis comparator. Furthermore, reference voltage regulation circuit 42 can also include single pulse circuit 42-4 and switch 51. Single pulse circuit 42-4 can receive a first voltage signal generated by the logic controller, and may generate switching control signal Vs through single pulse processing. Switch 51 can connect between capacitor CT and output voltage signal VOUT of the multi-channel switching circuit. Also, switching control signal Vs can control the switching operation of switch 51.

Figure 6B:
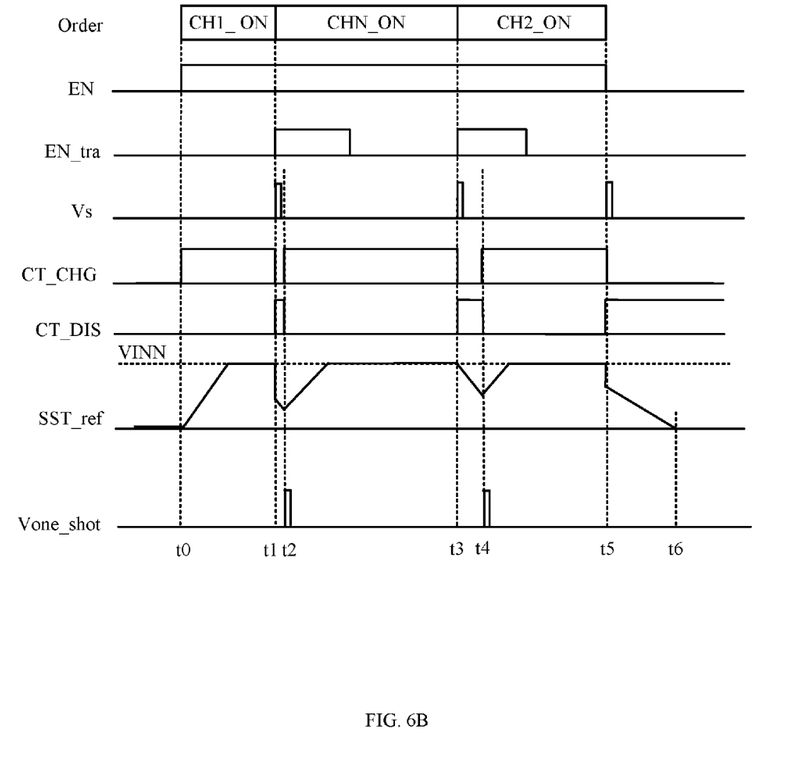
FIG. 6B is a waveform diagram of example operation of the circuit of FIG. 6A, in accordance with embodiments of the present invention.

Referring now to FIG. 6B, shown is a waveform diagram of example operation of the circuit of FIG. 6A, in accordance with embodiments of the present invention. In this example, a circuit with three channels is used with the first switching circuit being enabled at the start-up state, and then the system switching to the Nth switching circuit, and then further switched to the second switching circuit. Also, the input voltages in this particular example may have the relationship of VIN1<VIN2<VINN, such that the Nth input voltage is the largest one. At time t0, the system can enter an operation state, and operation signal Order may indicate that the first switching circuit is to operate (e.g., channel CH1_ON, and enable signal EN is active high). Charge signal CT_CHG generated by logic controller 42-1 can go active high, and maximum value selection circuit 42-2 may provide the Nth input voltage VINN as the output voltage to charge current source Ia. Charge current source Ia can charge capacitor CT, thus the voltage at the first terminal of capacitor CT may linearly rise to voltage VINN, and steadily remain at voltage VINN.

At time t1, operation signal Order can indicate that the Nth switching circuit is to to operate (e.g., the Nth channel CHN_ON, and enable signal EN remains high). Also, trigger signal EN_tra can go active high, charge signal CT_CHG may go inactive low, discharge signal CT_DIS may go active high, and charge current source Ia may be disabled. Discharge current source Ib can discharge capacitor CT. In this particular example, when trigger signal EN-tra goes active high, switching control signal Vs may also be active high. This can turn on switch S1 such that reference voltage signal SST_ref is pulled down to the current output voltage VOUT, in order to save the discharging time. Switching control signal Vs may be a relatively short pulse signal, as shown When reference voltage signal SST_ref is decreased to time t2, the difference between reference voltage signal SST_ref and the minimum one ON_Min(VIN1, VIN2 . . . VINN) of the input voltage signals that is currently participating the operation may reach Vdrop2. The minimum one ON_Min(VIN1, VIN2 . . . VINN) may be the smaller one of VIN1 and VINN, and single pulse signal Vone-shot turns may go active high. In addition, charge signal CT_CHG may go active high, discharge signal CT_DIS may go active low, and charge current source Ia can charge capacitor CT. Thus, the voltage at the first terminal of capacitor CT may rise to VINN and steadily remain at VINN. In this way, the adjustment of reference voltage signal SST_ref can be completed when the first switching circuit is switched to the Nth switching circuit. During the adjustment, trigger signal EN_tra can remain active high for a certain period, and then go inactive low.

At time t3, operation signal Order can indicate that the second switching circuit is to operate (e.g., channel CH2_ON). Input voltage VIN2 may be less/smaller than input voltage VINN, enable signal EN may remain high, and trigger signal EN_tra may go active high. Logic controller 42-1 can control charge signal CT_CHG to be inactive low, discharge signal CT_DIS can go active high, and switching control signal Vs may go active high such that switch S1 is turned on. However, reference voltage signal SST_ref may not immediately decrease because reference voltage signal SST_ref is substantially equal to the output voltage VOUT. Discharge current source Ib may then operate, and reference voltage signal SST_ref can begin decreasing until time t4.

When the difference between reference voltage signal SST_ref and the minimum one ON_Min(VIN1, VIN2 . . . VINN) of the input voltage signals that are currently participating in operation reaches a level of Vdrop2, ON_Min(VIN1, VIN2 . . . VINN) that is the smallest/lowest one of VIN2 and VINN, and single pulse signal Vone-shot may go active high. Charge signal CT_CHG may go active high, discharge signal CT_DIS they go inactive low, and charge current source Ia can charge capacitor CT. Thus, the voltage at the first terminal of capacitor CT may linearly rise to VINN, and may steadily remain at VINN. In this way, the adjustment of reference voltage signal SST_ref can be completed when the Nth switching circuit is switched to the second switching circuit. In this example, reference voltage signal SST_ref can adjust along with the different input voltages during the switching operation of the input voltage, such that the output voltage may be stable during the switching, and voltage drop of the output voltage may be substantially avoided.

In one embodiment, a method of controlling a multi-channel switching circuit having a plurality of switching circuits, input terminals respectively coupled to a plurality of input voltage signals, and an output terminal for providing an output voltage signal, can include: (i) receiving, by a logic control circuit, an external operation signal and a first single pulse signal, and generating an enable signal, a trigger signal, and a plurality of feedback control signals; (ii) receiving, by a reference voltage regulation circuit, the enable signal, the trigger signal, and a maximum one of the plurality of the input voltage signals, and generating a reference voltage signal; (iii) generating, by the reference voltage regulation circuit being, the first single pulse signal according to the reference voltage signal and a minimum one of two input voltage signals that are participating in a switching operation; and (iv) receiving, by a plurality of feedback circuits corresponding to the plurality of switching circuits, the plurality of feedback control signals, a minimum one of two input voltage signals that are participating in the switching operation, the reference voltage signal, and the output voltage signal, and generating a plurality of switching control signals for controlling the plurality of switching circuits.

Figure 7:
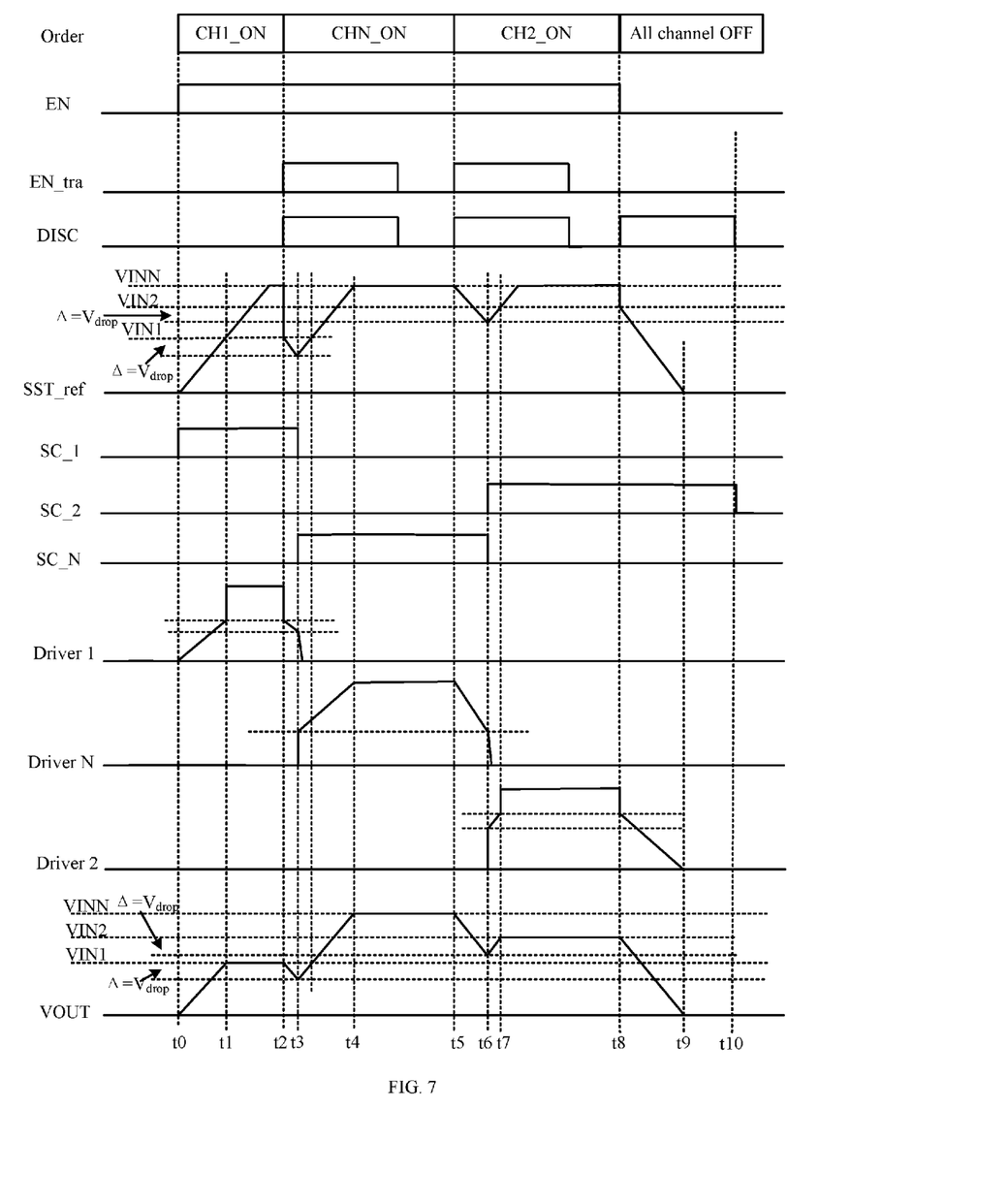
FIG. 7 is a waveform diagram of example operation of the circuit of FIG. 5, in accordance with embodiments of the present invention.

Referring now to FIG. 7, shown is a waveform diagram of example operation of the circuit of FIG. 5, in accordance with embodiments of the present invention. The following may describe an example switching procedure between different input voltages in conjunction with FIGS. 5, 6B, and 7, with the example circuit having three channels. Also for example, the circuit can begin with the first switching circuit being enabled/operational, then the operation may be switched to the Nth switching circuit, and then further switched to the second switching circuit. Also for example, the input voltages may have the relationship of VIN1<VIN2<VINN.

At time t0, logic control circuit 41 can receive operation signal Order that indicates channel CH1_ON is to operate, enable signal EN can go active high, and feedback control signal SC_1 of the first channel may go active high. Reference voltage signal SST_ref can be coupled to the non-inverting input terminal of the transconductance amplifier of the first feedback circuit. Based on the above described operation procedure of the reference voltage regulation circuit, when reference voltage signal SST_ref begins rising, driving signal Driver 1 can begin rising, and output voltage VOUT can also begin rising. From time t0 to time t1, in the function of the first transconductance amplifier, the driver 1 may gradually rise in order to realize a soft start-up of the output voltage. At time t1, switches Q1 and Q2 of the first switching circuit may be completely turned on, and output voltage VOUT can output VIN1. Thereafter, reference voltage signal SST_ref can continue rising to, and being maintained at, VINN, and the output voltage VOUT may be maintained at VIN1.

At time t2, operation signal Order can indicate that the Nth switching circuit is to operate (e.g., channel CHN_ON and trigger signal EN_tra goes active high). Also, discharge signal DISC may go active high, and in view of the operation procedure of the reference voltage regulation circuit, reference voltage signal SST_ref can begin discharging after being quickly pulled up to the level of output voltage VOUT. Output voltage VOUT can decrease due to the discharging of discharge resistor RDIS. In order to facilitate the control of the discharge circuit, the discharge time of discharge circuit 45 may be set to be a predetermined value (e.g., by a user) such that the discharge time meets circuit requirements, or other considerations with respect to the voltage logic.

At time t3, reference voltage signal SST_ref may be decreased to the difference between VIN1 and Vdrop2, and in the function of the first transconductance amplifier, the output voltage VOUT may also be decreased to the difference between VIN1 and Vdrop1. Voltage Vdrop 1 may be equal to voltage Vdrop2, and single pulse signal Vone-shot generated by the reference voltage regulation circuit may go active high. After logic control circuit 41 receives the active high transition of single pulse signal Vone-shot, feedback control signal SC_1 may go inactive low, and feedback control signal SC_N may go active high. The single pole double throw switch in feedback circuit SW_1 can couple the difference between the minimum one ON_Min(VIN1, VIN2 . . . VINN) of the input voltage signals that are participating in operation and Vdrop1 (e.g., VIN1−Vdrop1) to the non-inverting input terminal of the transconductance amplifier gm1. Also, the single pole double throw switch in the Nth feedback circuit SW_N can couple reference voltage signal SST_ref to the non-inverting input terminal of transconductance amplifier gmN.

From time t3 to time t4, reference voltage signal SST_ref may gradually rise, and per the function of transconductance amplifier gmN, the output of driver N can rise. Also, the switches of the Nth switching circuit may be softly turned on, and output voltage VOUT can begin increasing from VIN1−Vdrop1. In addition, for the first switching circuit, the voltage at the non-inverting input terminal of transconductance amplifier gm1 can be VIN1−Vdrop1, and the voltage at the inverting input terminal may be output voltage VOUT. When VOUT>VIN1−Vdrop1, the output of driver 1 may decrease to zero with the control of the transconductance amplifier gm1, and the switches of the first switching circuit can be off.

For example, voltage Vdrop1 is a voltage drop of output voltage VOUT set by the system, and the value can be far less than the diode drop (e.g., about 50 mV). Based on the above configuration, the switches of the first switch circuit may be completely off before output voltage VOUT rises to the level of input voltage VIN1 because of voltage Vdrop1. Thus, the time period during which the output of driver 1 decreases to zero can be less than the time period during which output voltage VOUT increases to VIN1 by driver N. As a result, the occurrence of the output voltage being greater than input voltage VIN1 even the switches of the first switch circuit are not fully off can be substantially avoided, in order to prevent current from flowing back to the first input terminal from output OUT.

At time t4, the output of driver N may rise until switches QM and QN are completely on, and output voltage VOUT=VINN, thus output voltage VOUT can switch from VIN1 to VINN. As shown, output voltage VOUT may only drop by the voltage Vdrop1 in a relatively short time period during the switching operation. Thus, the overall fluctuation is may be relatively small, and the channel switching can be completed relatively smoothly. At time t5, operation signal Order may indicate that the second switching circuit is to operate (e.g., channel CH2_ON, trigger signal EN_tra goes active high). Reference voltage signal SST_ref can decrease by discharging, and the output of driver N can accordingly decrease. The discharge circuit can be enabled, discharge switch Qdis may turn on, and the discharge resistor can discharge output voltage VOUT, such that output voltage VOUT decreases.

At time t6, when reference voltage signal SST_ref decreases to VIN2−Vdrop2, due to the function of transconductance amplifier gm_N, output voltage VOUT may also decrease to VIN2−Vdrop1. Single pulse signal Vone-shot can go active high, feedback control signal SC_N can go inactive low, and feedback control signal SC_2 can go active high. The single pole double throw switch in the Nth feedback circuit SW_N can couple the difference between the minimum one ON_Min(VIN1, VIN2 . . . VINN) of the input voltage signals that are participating in operation currently and Vdrop1 (e.g., VIN2−Vdrop1) to the non-inverting input terminal of transconductance amplifier gmN. Also, the single pole double throw switch in feedback circuit SW_2 can connect reference voltage signal SST_ref to the non-inverting input terminal of transconductance amplifier gm2.

From time t6 to t7, reference voltage signal SST_ref may gradually rise, and due to the function of transconductance amplifier gm2, the output of driver 2 may gradually rise. Thus, switches Q3 and Q4 of the second switching circuit can be softly turned on, and output voltage VOUT may gradually increase from VIN2−Vdrop1. For the Nth switching circuit, the output of the driver N may gradually decrease to zero with the control of transconductance amplifier gmN. Then, the output of driver 2 may gradually rise until switches Q3 and Q4 are completely turned on at time t7, and output voltage VOUT=VIN_2. Therefore, output voltage VOUT can be switched from VINN to VIN2. Similarly, during the procedure, the switches of the second switching circuit can be completely turned on after output voltage VOUT is decreased to VIN2−Vdrop1 because of voltage Vdrop1. This can prevent current from flowing back to the second input voltage terminal from the output voltage terminal. Also, during the switching operation, output voltage VOUT may only drop by voltage Vdrop1 in a relatively short time period. As a result, the overall fluctuation may be relatively small, and the channel switching can be realized relatively smoothly.

At time t8, operation signal Order can indicate that the system is to shut down or otherwise be disabled. Reference voltage signal SST_ref may linearly decrease after being pulled down to VIN2. Also, the discharge circuit can operate or be enabled, and the discharge resistor can discharge output voltage VOUT until time t9. Reference voltage signal SST_ref may be decreased to zero, output voltage VOUT can also be decreased to zero, and the output of driver 1 may be zero. After a delay time (e.g., a predetermined fixed delay time) has elapsed, the system can effectively be shut down at time t10.

In particular embodiments, when the external input voltage should be switched, the logic control circuit may output feedback control signals, and the feedback circuit in the switching operation may select and provide a corresponding reference voltage signal to the feedback path that is to be switched according to the feedback control signal, in order to control the switching operation of a corresponding switching circuit, and to realize input voltage switching. In this way, the output voltage may not drop during the channel switching, and the value of the output voltage may remain substantially stable.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A switching control circuit for controlling a multi-channel switching circuit having a plurality of switching circuits, input terminals respectively coupled to a plurality of input voltage signals, and an output terminal for providing an output voltage signal, the switching control circuit comprising:
   a) a logic control circuit configured to receive an external operation signal and a first single pulse signal, and to generate an enable signal, a trigger signal, and a plurality of feedback control signals;
   b) a reference voltage regulation circuit configured to receive said enable signal, said trigger signal, and a maximum one of said plurality of said input voltage signals, and to generate a reference voltage signal;
   c) said reference voltage regulation circuit being configured to generate said first single pulse signal according to said reference voltage signal and a minimum one of two input voltage signals that are participating in a switching operation; and
   d) a plurality of feedback circuits corresponding to said plurality of switching circuits, wherein said plurality of feedback circuits are configured to receive said plurality of feedback control signals, a minimum one of two input voltage signals that are participating in said switching operation, said reference voltage signal, and said output voltage signal, and to generate a plurality of switching control signals for controlling said plurality of switching circuits.

2. The switching control circuit of claim 1, wherein each feedback circuit comprises:
   a) a signal selection circuit configured to provide one of said reference voltage signal and said minimum one of said two input voltage signals that are participating in said switching operation to said comparison circuit according to said feedback control signal of a corresponding channel; and
   b) a comparison circuit configured to receive an output signal of said signal selection circuit and said output voltage signal of said multi-channel switching circuit, and to generate a switching control signal for said corresponding channel.

3. The switching control circuit of claim 2, wherein:
   a) said signal selection circuit comprises a single pole double throw switch that couples said reference voltage signal to a first input terminal of a transconductance amplifier when said feedback control signal is active, and that couples said minimum one of said two input voltage signals that are participating in said switching operation to said first input terminal of said transconductance amplifier when said feedback control signal is inactive; and
   b) said comparison circuit comprises a transconductance amplifier configured to receive said output signal of said signal selection circuit, and said output voltage signal of said multi-channel switching circuit, and to generate a switching control signal for a corresponding channel.

4. The switching control circuit of claim 2, wherein each of said feedback circuits comprises a first voltage source having an anode configured to receive said minimum one of said two input voltage signals that are participating in said switching operation, and a cathode coupled to an input terminal of said signal selection circuit.

5. The switching control circuit control circuit of claim 1, wherein said reference voltage regulation circuit comprises:
a) a logic controller configured to receive said enable signal, said trigger signal, and said first single pulse signal, and to generate a charge signal and a discharge signal;
b) a charge and discharge circuit comprising a charge current source, a discharge current source, and a first capacitor, wherein said charge current source comprises a first terminal configured to receive a maximum one of said plurality of input voltage signals, and a second terminal coupled to a first terminal of said first capacitor, and wherein said discharge current source is coupled in parallel to said first capacitor, a second terminal of said first capacitor is grounded, and a voltage across said first capacitor is configured as said reference voltage signal;
c) said charge current source being configured to receive said charge signal, and to charge said first capacitor when said charge signal is active;
d) said discharge current source being configured to receive said discharge signal, and to discharge said first capacitor when said discharge signal is active; and
e) a first single pulse generator configured to receive said reference voltage signal and said minimum one of said two input voltage signals that are participating in said switching operation, and to generate said first single pulse signal.

6. The switching control circuit of claim 5, wherein said first single pulse generator comprises:
a) a first hysteresis comparator configured to receive said minimum one of said two input voltage signals that are participating in said switching operation, and said reference voltage signal, and to generate a hysteresis comparison signal; and
b) a first single pulse circuit configured to generate said first single pulse signal from said hysteresis comparison signal.

7. The switching control circuit of claim 6, wherein said first single pulse generator comprises a second voltage source having an anode configured to receive said minimum one of said two input voltage signals that are participating in said switching operation, and a cathode coupled to a non-inverting input terminal of said first hysteresis comparator.

8. The switching control circuit of claim 5, wherein said reference voltage regulation circuit comprises:
a) a second single pulse circuit configured to receive a first voltage signal generated by said logic controller, and to generate a first switching control signal; and
b) a first switch having a first terminal being coupled to a first terminal of said first capacitor, a second terminal configured to receive said output voltage signal of said multi-channel switching circuit, wherein said first switch is controllable by said first switching control signal.

9. The switching control circuit of claim 1, wherein said switching control circuit comprises a discharge circuit having a discharge resistor and a discharge switch that are coupled in series between said output terminal and ground, wherein said discharge switch is controlled by a discharge control signal that is generated by said logic control circuit.

10. A method of controlling a multi-channel switching circuit having a plurality of switching circuits, input terminals respectively coupled to a plurality of input voltage signals, and an output terminal for providing an output voltage signal, the method comprising:
a) receiving, by a logic control circuit, an external operation signal and a first single pulse signal, and generating an enable signal, a trigger signal, and a plurality of feedback control signals;
b) receiving, by a reference voltage regulation circuit, said enable signal, said trigger signal, and a maximum one of said plurality of said input voltage signals, and generating a reference voltage signal;
c) generating, by said reference voltage regulation circuit being, said first single pulse signal according to said reference voltage signal and a minimum one of two input voltage signals that are participating in a switching operation; and
d) receiving, by a plurality of feedback circuits corresponding to said plurality of switching circuits, said plurality of feedback control signals, a minimum one of two input voltage signals that are participating in said switching operation, said reference voltage signal, and said output voltage signal, and generating a plurality of switching control signals for controlling said plurality of switching circuits.

11. The method of claim 10, further comprising:
a) providing, by a signal selection circuit, one of said reference voltage signal and said minimum one of said two input voltage signals that are participating in said switching operation to said comparison circuit according to said feedback control signal of a corresponding channel; and
b) receiving, by a comparison circuit, an output signal of said signal selection circuit and said output voltage signal of said multi-channel switching circuit, and generating a switching control signal for said corresponding channel.

12. The method of claim 11, further comprising:
a) coupling, by a single pole double throw switch, said reference voltage signal to a first input terminal of a transconductance amplifier when said feedback control signal is active;
b) coupling, by said single pole double throw switch, said minimum one of said two input voltage signals that are participating in said switching operation to said first input terminal of said transconductance amplifier when said feedback control signal is inactive; and
c) receiving, by a transconductance amplifier, said output signal of said signal selection circuit, and said output voltage signal of said multi-channel switching circuit, and generating a switching control signal for a corresponding channel.

13. The method of claim 10, further comprising:
a) receiving, by a logic controller, said trigger signal, and said first single pulse signal, and generating a charge signal and a discharge signal;
b) charging a first capacitor when said charge signal is active;
c) discharging said first capacitor when said discharge signal is active; and
d) receiving, by a first single pulse generator, said reference voltage signal and said minimum one of said two input voltage signals that are participating in said switching operation, and generating said first single pulse signal.

14. The method of claim 13, further comprising:
a) receiving, by a first hysteresis comparator, said minimum one of said two input voltage signals that are participating in said switching operation, and said reference voltage signal, and generating a hysteresis comparison signal; and b) generating, by a first single pulse circuit, said first single pulse signal from said hysteresis comparison signal.

15. The method of claim 14, further comprising:
a) receiving, by a second single pulse circuit configured, a first voltage signal generated by said logic controller, and generating a first switching control signal; and
b) controlling a first switch by said first switching control signal, wherein said first switch comprises a first terminal coupled to a first terminal of said first capacitor, and a second terminal coupled to said output voltage signal.

16. The method of claim 10, further comprising controlling, by a discharge control signal that is generated by said logic control circuit, a discharge switch that is coupled in series with a discharge resistor and between said output terminal and ground.

* * * * *